United States Patent [19]

Komatsu et al.

[11] 4,404,236
[45] Sep. 13, 1983

[54] HIGH PRESSURE CHEMICAL VAPOR DEPOSITION

[75] Inventors: Shoichi Komatsu; Seiichi Iwamatsu, both of Suwa, Japan

[73] Assignee: Kabushiki Kaisha Suwa Seikosha, Tokyo, Japan

[21] Appl. No.: 314,305

[22] Filed: Oct. 23, 1981

[30] Foreign Application Priority Data

Oct. 24, 1980 [JP]  Japan .................... 55-149206

[51] Int. Cl.³ ................ H01L 21/316; H01L 21/318
[52] U.S. Cl. ...................... 427/94; 427/93; 427/255.2; 427/255.3; 427/255.7; 427/255; 427/95
[58] Field of Search ............... 427/93, 94, 95, 255, 427/255.1, 255.2, 255.3, 255.7, 39

[56] References Cited

U.S. PATENT DOCUMENTS 3,573,096  3/1971  Tombs .................................. 427/94
3,843,398  10/1974 Maagdenberg .................... 427/95
4,282,270  8/1981  Nozaki et al. ........................ 427/93

FOREIGN PATENT DOCUMENTS 55-22862   2/1980  Japan ..................................... 427/93
1530337   10/1978  United Kingdom ............. 427/255.3

Primary Examiner—John D. Smith
Assistant Examiner—Bernard F. Plantz
Attorney, Agent, or Firm—Blum, Kaplan, Friedman, Silberman and Beran

[57] ABSTRACT

A process for carrying out chemical vapor deposition under increased pressure is provided. By carrying out chemical vapor deposition under increased pressure, a boundry layer of reduced thickness is formed which permit formation of a chemical vapor reaction film in the minute necking portions on the surface of the substrate formed during formation of the electrical components, such as a transistor or an integrated circuit. The step of chemical vapor deposition under increased pressure may be followed by chemical vapor deposition at normal or reduced pressure for forming a film of uniform thickness across the wafer.

13 Claims, 5 Drawing Figures

HIGH PRESSURE CHEMICAL VAPOR DEPOSITION

BACKGROUND OF THE INVENTION

This invention relates to chemical vapor deposition, and in particular to chemical vapor deposition carried out at pressures greater than 1 atmosphere.

Chemical vapor deposition is particularly well suited for forming a $SiO_2$ film, a $Si_3N_4$ film, an Si film or the like in semiconductor fabrication. When forming a semiconductor device, such as a transistor or an integrated circuit (IC), interconnectors having an uneven surface are disposed on the semiconductor substrate. In contrast, an oxide film, such as $SiO_2$ film, or a nitride film, such as $Si_3N_4$, are formed by means of a chemical vapor reaction. In accordance with conventional fabrication techniques, in order to promote the above-noted chemical reactions, a layer is grown on the substrate while heating the semiconductor substrate under normal or reduced pressure. However, the chemical reactions under normal pressures or reduced pressures present problems in that the film is not efficiently formed in the region of minute uneven portions of the substrate. In other words, the coverage of the film formed by the chemical vapor deposition is not completely satisfactory.

Accordingly, it is desirable to provide an improved process for carrying chemical vapor deposition wherein the thickness of a boundry layer formed on the substrate will overcome the problems presented by the conventional chemical vapor deposition.

SUMMARY OF THE INVENTION

Generally speaking, in accordance with the invention, material in vapor form is disposed on a substrate by chemical reaction wherein the chemical reaction is carried out at pressures greater than 1 atmosphere. Preferably, the pressure is maintained between about 2 and 10 atmospheres and temperatures between 150° and 800° C. When forming a layer in accordance with the CVD of the invention under pressure, the thickness of the resultant layer varies inversely with the pressure. In order to obtain a layer of sufficient uniform thickness, CVD under normal pressure may follow CVD under increased pressure in order to provide a uniform layer at various boundary and necking regions of the substrate.

Accordingly, it is an object of the invention to provide an improved chemical vapor deposition process.

Another object of the invention is to provide an improved chemical vapor deposition process for providing uniform coverage at necking regions in the substrate.

A further object of the invention is to provide a chemical vapor deposition process to be carried out at pressures greater than 1 atmosphere.

Still another object of the invention is to provide an improved chemical vapor deposition process wherein a boundary layer is formed under pressures greater than 1 atmosphere and a film is formed by chemical vapor deposition at normal or reduced pressures.

Still a further object of the invention is to provide an improved process for preparing a $SiO_2$, $Si_3N_4$ or a Si film by chemical vapor deposition on a substrate.

Still other objects and advantages of the invention will in part be obvious and will in part be apparent from the specification.

The invention accordingly comprises the several steps and the relation of one or more of such steps with respect to each of the others thereof, which will be exemplified in the process hereinafter disclosed and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1A:
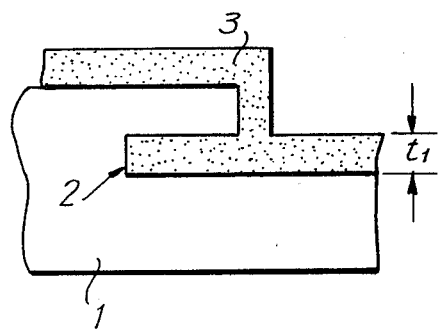
FIGS. 1(*a*) and (*b*) are cross-sectional views of films formed by chemical vapor deposition under normal or reduced pressure.
Figure 1B:
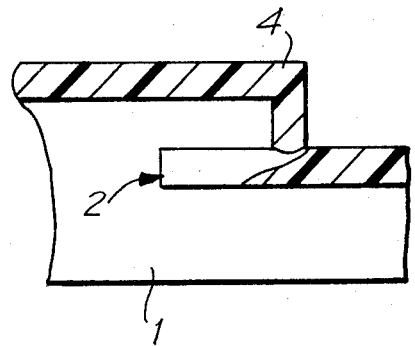

In accordance with conventional chemical vapor reaction a boundary layer is formed on the surface of the substrate at the time of reacting. The thickness of the boundary layer influences the thickness of the disposed film. A substrate 1 having a necking portion 2 is shown in FIG. 1(*a*). When the chemical vapor reaction occurs on substrate 1 under conditions of reduced pressure, a boundary layer 3 with a thickness $t_1$ is formed between the reacting gas and substrate 1. Boundary layer 3 fills in necking portion 2 so that additional reacting gas is prevented from reaching necking portion 2. FIG. 1(*b*) illustrates a chemical vapor deposition film 4 formed by diffusing into boundary layer 3 (of FIG. 1(*a*)) which results in insufficient coverage in necking portion 2. Thus, CVD layer 4 does not form within necking portion 2.

Figure 2A:
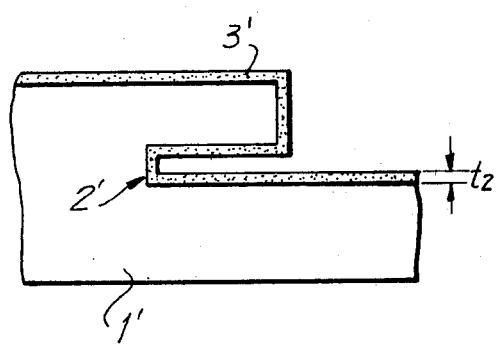
FIGS. 2(*a*) and (*b*) are cross-sectional views illustrating film formed by chemical vapor deposition under pressure greater than 1 atmosphere in accordance with the invention.
Figure 2B:
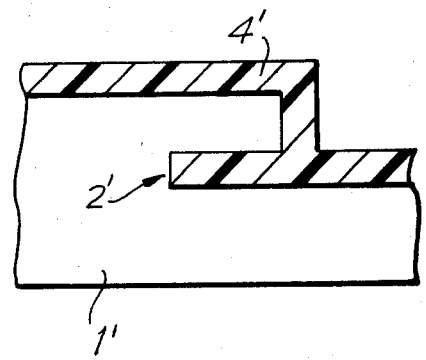

When the chemical vapor reaction is carried out under pressure in accordance with the invention, a boundary layer 3' having a thickness $t_2$ as shown in FIG. 2(*a*) is formed. Thickness $t_2$ is less than thickness $t_1$ of boundary layer 3 formed under reduced pressure so that the reacting gas is permitted to pass into necking portion 2'. As shown in FIG. 2(*b*), a chemical vapor deposition film 4' is formed by diffusion in boundary layer 3 which results in improved coverage inside necking portion 2'.

The thickness of boundary layer 3' is inversely proportional to the pressure under which the chemical vapor reaction is carried out. In other words, the greater the pressure of the chemical vapor reaction, the thinner the thickness of boundary layer 3'. In view of this, the reaction gas extends into necking portion 2' without being inhibited by the presence of a boundary layer, such as boundary layer 2 in FIG. 1(*a*). This permits chemical vapor deposition film 4' to be formed uniformly with high speed by diffusing into boundary layer 3'. As noted above, this provides sufficient coverage of chemical vapor deposition film 4' over the region of necking portion 2'.

Under conventional CVD methods, CVD is carried out under normal or reduced pressures. CVD under normal pressure is utilized for preparing a film when some variation in thickness of the film is acceptable. On the other hand, when the semiconductor substrate is substantially flat, CVD under reduced pressure provides a film having a uniform thickness. Accordingly, CVD under reduced pressure is utilized when variation of thickness in the film must be maintained at a minimum. However, film is not deposited on the inside of the concave portions on the surface of the substrate, such minute concave portions present when fabricating super-LSI. To overcome this, CVD under normal pressure may be employed which provides more coverage in the concave portions of the substrate than CVD under reduced pressure; however, coverage within the minute concave portions is less than that on the surface.

When a CVD film is formed by CVD under pressure in accordance with the invention, the film formed in the minute concave portions is the same thickness as that on the surface of the substrate. At the same time, over the flat portion of the substrate, variation in thickness of the film increases when CVD is done under pressure. Variation is greatest when CVD is done under pressure and reduced somewhat when CVD is done under normal pressure and only minor variations occur when the CVD is done under reduced pressure. However, at the minute uneven portions of the substrate, coverage increases for CVD under reduced pressure over CVD under normal pressure and in turn CVD under pressure. Thus, CVD under reduced pressure has been considered to be the most acceptable procedures.

Figure 3:
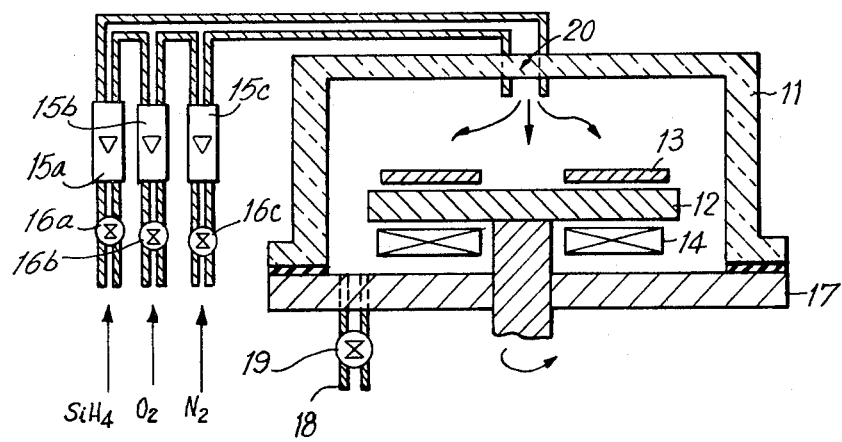
FIG. 3 is a cross-sectional elevational view of a device for carrying out chemical vapor deposition in accordance with the invention.

In order to attain the above-noted objects of the invention, the film to be formed on the substrate by a chemical vapor reaction is carried out under conditions or more than 1 atmosphere pressure. Preferably, the chemical vapor deposition is carried out at pressures from about 2 to 10 atmospheres. The temperature of the chemical vapor reaction is maintained between about 150° to 800° C. This method of carrying out the chemical vapor reaction will be described in an example utilizing the device illustrated in FIG. 3.

A silicon wafer 13 for receiving the chemical vapor deposition film is positioned on a quartz jig 12 mounted for rotation within a transparent quartz glass jar 11. A heater block 14 for heating the region within jar 11 is disposed beneath jig 12. Transparent quartz jar 11 is mounted on a stainless steel base 17.

Pressurized gas, such as $SiH_4$, $O_2$ and $N_2$ for forming an $SiO_2$ film are introduced into quartz jar 11 at an inlet 20 through flow meters 15a, 15b and 15c. Pressure of the entering gases are regulated by a series of pressure regulators 16a, 16b and 16c for maintaining the pressure at inlet 20 at about 10 atmosphere (1 atm = 1 kg/cm$^2$). The $SiH_4$, $O_2$ and $N_2$ gasses introduced into quartz jar 11 are maintained at pressures of about 1 atmosphere of $SiH_4$, 1 atmosphere of $O_2$ and 8 atmospheres of $N_2$.

The gas filling transparent quartz jar 11 is heated to 400° C. by means of heater block 14, and a chemical vapor deposition $SiO_2$ film is formed on the surface of the silicon wafer. This film is formed in accordance with the chemical reaction as follows:

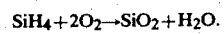

$$SiH_4 + 2O_2 \rightarrow SiO_2 + H_2O.$$

A portion of the reacting gas is discharged to a drain 18 through a pressure control regulator 19. When chemical vapor deposition is carried out in accordance with this procedure, a chemical vapor deposition film with sufficient coverage can be formed in the necking region of a silicon substrate.

In an additional example, a $Si_3N_4$ film was formed on another silicon wafer 13 in quartz jar 11. The entering $SiH_4$, $NH_4$ and $H_2$ gasses were maintained at pressures of 1 atmosphere, 1 atmosphere and 8 atmospheres, respectively, and heated to a temperature of about 400° C.

The invention can also be practiced pursuant to an alternative embodiment. For example, after chemical vapor deposition is carried out under the conditions of the invention, namely of pressure between 2 and 10 atmospheres, a chemical vapor deposition film is formed under normal prressures or reduced pressures. In other words, a chemical vapor deposition film is first formed in the minute uneven or necking portions with sufficient coverage under sufficient pressure to insure a thin boundary layer in accordance with the invention and then followed by chemical vapor deposition of the film having a uniform thickness across the wafer is formed under normal pressure or reduced pressure. Accordingly, by first forming a boundary layer of reduced thickness by chemical vapor deposition under greater than atomspheric pressure followed by chemical vapor deposition under normal or reduced pressure provides an improved chemical vapor deposition film on the substrate is obtained.

It will thus be seen that the objects set forth above, among those made apparent from the preceding description, are efficiently attained and, since certain changes may be made in carrying out the above process without departing from the spirit and scope of the invention, it is intended that all matter contained in the above description shall be interpreted as illustrative and not in a limiting sense.

It is also understood that the following claims are intended to cover all of the generic and specific features of the invention herein described, and all statements of the scope of the invention which, as a matter of language, might be said to fall therebetween.

What is claimed is:

1. In a process of chemical vapor deposition wherein a thin $SiO_2$ film is formed on a substrate by chemical reaction of a vapor, the improvement which comprises carrying out the chemical vapor deposition at a pressure greater than at least 2 atmospheres.

2. The chemical vapor deposition process of claim 1, wherein the pressure is maintained between about 2 and 10 atmospheres.

3. The chemical deposition process of claim 2, further including maintaining the temperature between about 150° C. and 800° C.

4. The chemical vapor process of claim 3, wherein the temperature is maintained at about 400° C.

5. The chemical vapor deposition process of claim 1, for forming a $SiO_2$ film on a Si wafer substrate, wherein the gas comprises about 1 atmosphere $SiH_4$, 1 atmosphere $O_2$ and 8 atmospheres $N_2$.

6. The chemical vapor deposition process of claim 5, wherein the temperature is maintained at about 400° C.

7. In a process of chemical vapor deposition for forming a $Si_3N_4$ film on a Si wafer substrate the improvement which comprises carrying out the chemical vapor deposition with a gas comprising about 1 atmosphere $SiH_4$, 1 atmosphere $NH_4$ and 8 atmospheres $N_2$.

8. The chemical vapor deposition process of claim 7, wherein the temperature is maintained at about 400° C.

9. The chemical vapor deposition process of claim 1, further including the additional step of forming a further chemical vapor deposition film at atmospheric or reduced pressures.

10. A chemical vapor deposition process comprising:
   forming a thin boundary layer of one of $SiO_2$ or $Si_3N_4$ on the surface of a substrate by subjecting the substrate to a vopor reaction at pressures between about 2 and 10 atmospheres at elevated temperatures between about 150° and 800° C.; and forming a further film on the thin boundary layer by chemical vapor deposition at normal or reduced pressures for forming a uniform film on the substrate.

11. The chemical vapor deposition process of claim 10, wherein the substrate is a silicon wafer.

12. The chemical vapor deposition process of claim 5, further including the additional step of forming a further chemical vapor deposition film on the thin film of $SiO_2$ at atmospheric or reduced pressures.

13. The chemical vapor deposition process of claim 7, further including the additional step of forming a further chemical vapor deposition film on the thin film of $Si_3N_4$ at atmospheric or reduced pressures.

* * * * *